(12) United States Patent
Harris et al.

(10) Patent No.: US 10,446,585 B2
(45) Date of Patent: Oct. 15, 2019

(54) MULTI-LAYER EXPANDING ELECTRODE STRUCTURES FOR BACKPLANE ASSEMBLIES

(71) Applicant: E INK Corporation, Billerica, MA (US)

(72) Inventors: George G. Harris, Woburn, MA (US); Stephen J. Telfer, Arlington, MA (US); Richard J. Paolini, Jr., Framingham, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 14/660,642

(22) Filed: Mar. 17, 2015

(65) Prior Publication Data
US 2015/0261057 A1    Sep. 17, 2015

Related U.S. Application Data

(60) Provisional application No. 61/954,144, filed on Mar. 17, 2014.

(51) Int. Cl.
*G02F 1/153*    (2006.01)
*H01L 27/12*    (2006.01)
(Continued)

(52) U.S. Cl.
CPC ........ *H01L 27/124* (2013.01); *G02F 1/13336* (2013.01); *G02F 1/13452* (2013.01); *G02F 1/163* (2013.01); *G02F 1/167* (2013.01); *G02B 26/005* (2013.01); *G02B 26/026* (2013.01); *G02F 1/1676* (2019.01);
(Continued)

(58) Field of Classification Search
USPC ........ 359/237, 245, 247, 252–254, 290–292, 359/295, 296, 298
See application file for complete search history.

(56) References Cited

U.S. PATENT DOCUMENTS 4,418,346 A    11/1983    Batchelder
5,760,761 A    6/1998    Sheridon
(Continued)

FOREIGN PATENT DOCUMENTS

EP    1099207    5/2001
EP    1145072    10/2001
(Continued)

OTHER PUBLICATIONS

Wood, D., "An Electrochromic Renaissance?" Information Display, 18(3), Mar. 24, 2002 Mar. 1, 2002.
(Continued)

*Primary Examiner* — Brandi N Thomas
(74) *Attorney, Agent, or Firm* — Zhen Bao

(57) ABSTRACT

The present invention provides for an electro-optic display having a backplane assembly with at least two electrode layers, a first electrode layer of a first dimension electrically connected to and driving a second electrode layer of a second dimension that is larger than the first dimension. The second electrode layer overlies the first electrode layer, such that the entire viewing area of an electro-optic display may be optically-active. The backplane assembly may have at least one interposer layer disposed between the two electrode layers to electrically connect the first and second electrode layers.

15 Claims, 10 Drawing Sheets

(51) Int. Cl.
  *G02F 1/163* (2006.01)
  *G02F 1/1333* (2006.01)
  *G02F 1/1345* (2006.01)
  *G02F 1/167* (2019.01)
  *G02B 26/02* (2006.01)
  *G02B 26/00* (2006.01)
  *G02F 1/1676* (2019.01)

(52) U.S. Cl.
  CPC .. *G02F 2001/1635* (2013.01); *G02F 2201/12* (2013.01); *G02F 2201/42* (2013.01)

(56) References Cited

U.S. PATENT DOCUMENTS

| | | |
|---|---|---|
| 5,777,782 A | 7/1998 | Sheridon |
| 5,808,783 A | 9/1998 | Crowley |
| 5,872,552 A | 2/1999 | Gordon, II et al. |
| 6,054,071 A | 4/2000 | Mikkelsen, Jr. |
| 6,055,091 A | 4/2000 | Sheridon et al. |
| 6,097,531 A | 8/2000 | Sheridon |
| 6,124,851 A | 9/2000 | Jacobson |
| 6,128,124 A | 10/2000 | Silverman |
| 6,130,773 A | 10/2000 | Jacobson et al. |
| 6,130,774 A | 10/2000 | Albert et al. |
| 6,137,467 A | 10/2000 | Sheridon et al. |
| 6,144,361 A | 11/2000 | Gordon, II et al. |
| 6,147,791 A | 11/2000 | Sheridon |
| 6,172,798 B1 | 1/2001 | Albert et al. |
| 6,177,921 B1 | 1/2001 | Comiskey et al. |
| 6,184,856 B1 | 2/2001 | Gordon, II et al. |
| 6,225,971 B1 | 5/2001 | Gordon, II et al. |
| 6,232,950 B1 | 5/2001 | Albert et al. |
| 6,232,956 B1 | 5/2001 | Mailman |
| 6,241,921 B1 | 6/2001 | Jacobson et al. |
| 6,252,564 B1 | 6/2001 | Albert et al. |
| 6,271,823 B1 | 8/2001 | Gordon, II et al. |
| 6,301,038 B1 | 10/2001 | Fitzmaurice et al. |
| 6,312,304 B1 | 11/2001 | Duthaler et al. |
| 6,376,828 B1 | 4/2002 | Comiskey |
| 6,392,786 B1 | 5/2002 | Albert |
| 6,413,790 B1 | 7/2002 | Duthaler et al. |
| 6,422,687 B1 | 7/2002 | Jacobson |
| 6,445,374 B2 | 9/2002 | Albert et al. |
| 6,480,182 B2 | 11/2002 | Turner et al. |
| 6,498,114 B1 | 12/2002 | Amundson et al. |
| 6,506,438 B2 | 1/2003 | Duthaler et al. |
| 6,518,949 B2 | 2/2003 | Drzaic |
| 6,521,489 B2 | 2/2003 | Duthaler et al. |
| 6,535,197 B1 | 3/2003 | Comiskey et al. |
| 6,545,291 B1 | 4/2003 | Amundson et al. |
| 6,639,578 B1 | 10/2003 | Comiskey et al. |
| 6,657,772 B2 | 12/2003 | Loxley |
| 6,664,944 B1 | 12/2003 | Albert et al. |
| D485,294 S | 1/2004 | Albert |
| 6,672,921 B1 | 1/2004 | Liang et al. |
| 6,680,725 B1 | 1/2004 | Jacobson |
| 6,683,333 B2 | 1/2004 | Kazlas et al. |
| 6,724,519 B1 | 4/2004 | Comiskey et al. |
| 6,750,473 B2 | 6/2004 | Amundson et al. |
| 6,788,449 B2 | 9/2004 | Liang et al. |
| 6,816,147 B2 | 11/2004 | Albert |
| 6,819,471 B2 | 11/2004 | Amundson et al. |
| 6,825,068 B2 | 11/2004 | Denis et al. |
| 6,831,769 B2 | 12/2004 | Holman et al. |
| 6,842,167 B2 | 1/2005 | Albert et al. |
| 6,842,279 B2 | 1/2005 | Amundson |
| 6,842,657 B1 | 1/2005 | Drzaic et al. |
| 6,865,010 B2 | 3/2005 | Duthaler et al. |
| 6,866,760 B2 | 3/2005 | Paolini, Jr. et al. |
| 6,922,276 B2 | 7/2005 | Zhang et al. |
| 6,950,220 B2 | 9/2005 | Abramson et al. |
| 6,967,640 B2 | 11/2005 | Albert et al. |
| 6,980,196 B1 | 12/2005 | Turner et al. |
| 6,982,178 B2 | 1/2006 | LeCain et al. |
| 7,002,728 B2 | 2/2006 | Pullen et al. |
| 7,012,600 B2 | 3/2006 | Zehner et al. |
| 7,012,735 B2 | 3/2006 | Honeyman et al. |
| 7,030,412 B1 | 4/2006 | Drzaic et al. |
| 7,075,502 B1 | 7/2006 | Drzaic et al. |
| 7,075,703 B2 | 7/2006 | O'Neil et al. |
| 7,106,296 B1 | 9/2006 | Jacobson |
| 7,110,163 B2 | 9/2006 | Webber et al. |
| 7,116,318 B2 | 10/2006 | Amundson et al. |
| 7,148,128 B2 | 12/2006 | Jacobson |
| 7,167,155 B1 | 1/2007 | Albert et al. |
| 7,173,752 B2 | 2/2007 | Doshi et al. |
| 7,176,880 B2 | 2/2007 | Amundson et al. |
| 7,190,008 B2 | 3/2007 | Amundson et al. |
| 7,206,119 B2 | 4/2007 | Honeyman et al. |
| 7,223,672 B2 | 5/2007 | Kazlas et al. |
| 7,230,751 B2 | 6/2007 | Whitesides et al. |
| 7,236,291 B2 | 6/2007 | Kaga et al. |
| 7,256,766 B2 | 8/2007 | Albert et al. |
| 7,259,744 B2 | 8/2007 | Arango et al. |
| 7,280,094 B2 | 10/2007 | Albert |
| 7,304,634 B2 | 12/2007 | Albert et al. |
| 7,312,784 B2 | 12/2007 | Baucom et al. |
| 7,321,459 B2 | 1/2008 | Masuda et al. |
| 7,327,511 B2 | 2/2008 | Whitesides et al. |
| 7,339,715 B2 | 3/2008 | Webber et al. |
| 7,349,148 B2 | 3/2008 | Doshi et al. |
| 7,352,353 B2 | 4/2008 | Albert et al. |
| 7,365,394 B2 | 4/2008 | Denis et al. |
| 7,365,733 B2 | 4/2008 | Duthaler et al. |
| 7,382,363 B2 | 6/2008 | Albert et al. |
| 7,388,572 B2 | 6/2008 | Duthaler et al. |
| 7,411,719 B2 | 8/2008 | Paolini, Jr. et al. |
| 7,420,549 B2 | 9/2008 | Jacobson et al. |
| 7,442,587 B2 | 10/2008 | Amundson et al. |
| 7,453,445 B2 | 11/2008 | Amundson |
| 7,492,497 B2 | 2/2009 | Paolini, Jr. et al. |
| 7,535,624 B2 | 5/2009 | Amundson et al. |
| 7,551,346 B2 | 6/2009 | Fazel et al. |
| 7,554,712 B2 | 6/2009 | Patry et al. |
| 7,583,427 B2 | 9/2009 | Danner et al. |
| 7,598,173 B2 | 10/2009 | Ritenour et al. |
| 7,605,799 B2 | 10/2009 | Amundson et al. |
| 7,636,191 B2 | 12/2009 | Duthaler |
| 7,649,674 B2 | 1/2010 | Danner et al. |
| 7,667,886 B2 | 2/2010 | Danner et al. |
| 7,672,040 B2 | 3/2010 | Sohn et al. |
| 7,679,814 B2 | 3/2010 | Paolini, Jr. et al. |
| 7,688,497 B2 | 3/2010 | Danner et al. |
| 7,733,335 B2 | 6/2010 | Zehner et al. |
| 7,733,554 B2 | 6/2010 | Danner et al. |
| 7,785,988 B2 | 8/2010 | Amundson et al. |
| 7,821,079 B2 | 10/2010 | Cho et al. |
| 7,839,564 B2 | 11/2010 | Whitesides et al. |
| 7,843,626 B2 | 11/2010 | Amundson et al. |
| 7,859,637 B2 | 12/2010 | Amundson et al. |
| 7,893,435 B2 | 2/2011 | Kazlas et al. |
| 7,898,717 B2 | 3/2011 | Patry et al. |
| 7,957,053 B2 | 6/2011 | Honeyman et al. |
| 7,986,450 B2 | 7/2011 | Cao et al. |
| 8,009,344 B2 | 8/2011 | Danner et al. |
| 8,009,348 B2 | 8/2011 | Zehner et al. |
| 8,027,081 B2 | 9/2011 | Danner et al. |
| 8,049,947 B2 | 11/2011 | Danner et al. |
| 8,077,141 B2 | 12/2011 | Duthaler et al. |
| 8,089,453 B2 | 1/2012 | Comiskey et al. |
| 8,208,193 B2 | 6/2012 | Patry et al. |
| 8,319,759 B2 | 11/2012 | Jacobson et al. |
| 8,373,211 B2 | 2/2013 | Amundson et al. |
| 8,389,381 B2 | 3/2013 | Amundson et al. |
| 8,395,611 B2 | 3/2013 | Virtanen et al. |
| 8,498,042 B2 | 7/2013 | Danner et al. |
| 8,610,988 B2 | 12/2013 | Zehner et al. |
| 8,728,266 B2 | 5/2014 | Danner et al. |
| 8,754,859 B2 | 6/2014 | Gates et al. |
| 8,830,560 B2 | 9/2014 | Danner et al. |
| 8,848,388 B2 | 9/2014 | Sato |
| 8,891,155 B2 | 11/2014 | Danner et al. |
| 9,152,003 B2 | 10/2015 | Danner et al. |
| 9,152,004 B2 | 10/2015 | Paolini, Jr. et al. |

(56) References Cited

U.S. PATENT DOCUMENTS

| | | |
|---|---|---|
| 2002/0060321 A1 | 5/2002 | Kazlas et al. |
| 2004/0105036 A1 | 6/2004 | Danner et al. |
| 2005/0122306 A1 | 6/2005 | Wilcox et al. |
| 2005/0122563 A1 | 6/2005 | Honeyman et al. |
| 2005/0258752 A1 | 11/2005 | Kang |
| 2007/0052757 A1 | 3/2007 | Jacobson |
| 2007/0152956 A1* | 7/2007 | Danner ............. G02F 1/161 345/107 |
| 2007/0159574 A1* | 7/2007 | Burberry ............ G02F 1/133 349/74 |
| 2009/0122389 A1 | 5/2009 | Whitesides et al. |
| 2009/0315044 A1 | 12/2009 | Amundson et al. |
| 2010/0149929 A1* | 6/2010 | Braunberger ........ G04F 13/04 368/223 |
| 2011/0026101 A1 | 2/2011 | Wu et al. |
| 2011/0140744 A1 | 6/2011 | Kazlas et al. |
| 2011/0187683 A1 | 8/2011 | Wilcox et al. |
| 2011/0187689 A1 | 8/2011 | Bishop |
| 2011/0292319 A1 | 12/2011 | Cole |
| 2012/0293858 A1 | 11/2012 | Telfer et al. |
| 2015/0002497 A1* | 1/2015 | Dong ............... G09G 3/3655 345/211 |
| 2015/0261057 A1 | 9/2015 | Harris et al. |

FOREIGN PATENT DOCUMENTS

| | | |
|---|---|---|
| JP | 2007271957 A | 10/2007 |
| JP | 2008008963 A | 1/2008 |
| WO | 2000038000 | 6/2000 |
| WO | 2013105347 | 7/2013 |

OTHER PUBLICATIONS

O'Regan, B. et al., "A Low Cost, High-efficiency Solar Cell Based on Dye-sensitized colloidal TiO2 Films", Nature, vol. 353, Oct. 24, 1991, 773-740 Oct. 24, 1991.

Bach, U., et al., "Nanomaterials-Based Electrochromics for Paper-Quality Displays", Adv. Mater, 14(11), 845 (2002) Jun. 5, 2002.

Hayes, R.A., et al., "Video-Speed Electronic Paper Based on Electrowetting", Nature, vol. 425, Sep. 25, pp. 383-385 (2003) Sep. 25, 2003.

Kitamura, T., et al., "Electrical toner movement for electronic paper-like display", Asia Display/IDW '01, p. 1517, Paper HCS1-1 (2001) Jan. 1, 2001.

Yamaguchi, Y., et al., "Toner display using insulative particles charged triboelectrically", Asia Display/IDW '01, p. 1729, Paper AMD4-4 (2001) Jan. 1, 2001.

International Search Report and Written Opinion, PCT/US2015/021071, Korean Intellectual Property Office, dated Jun. 29, 2015.

European Patent Office; EP Appl. No. 15764452.5; Extended European Search Report; Jun. 28, 2017. Jun. 28, 2017.

* cited by examiner

MULTI-LAYER EXPANDING ELECTRODE STRUCTURES FOR BACKPLANE ASSEMBLIES

REFERENCE TO RELATED APPLICATIONS

This application is related to copending U.S. application Ser. No. 14/615,617, filed on Feb. 6, 2015.

The entire contents of these copending applications, and of all other U.S. patents and published and copending applications mentioned below, are herein incorporated by reference.

BACKGROUND OF INVENTION

In applications where individual electro-optic displays are tiled together to create a larger display, it is optimal for the viewing area to be completely active. Accordingly, the present invention provides for an electro-optic display having a backplane assembly with at least two electrode layers and at least one interposer layer disposed between the two electrode layers, a first electrode layer of a first dimension electrically connected to and driving a second electrode layer of a second dimension that is larger than the first dimension, such that the entire viewing surface area of the second electrode layer may be optically-active.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

Some electro-optic materials are solid in the sense that the materials have solid external surfaces, although the materials may, and often do, have internal liquid- or gas-filled spaces. Such displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071; 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation describe various technologies used in encapsulated electrophoretic and other electro-optic media. Such encapsulated media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. The technologies described in these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;

(c) Films and sub-assemblies containing electro-optic materials; see for example U.S. Pat. Nos. 6,982,178 and 7,839,564;

(d) Backplane assemblies, adhesive layers and other auxiliary layers and methods used in displays; see for example U.S. Pat. Nos. D485,294; 6,124,851; 6,130,773; 6,177,921; 6,232,950; 6,252,564; 6,312,304; 6,312,971; 6,376,828; 6,392,786; 6,413,790; 6,422,687; 6,445,374; 6,480,182; 6,498,114; 6,506,438; 6,518,949; 6,521,489; 6,535,197; 6,545,291; 6,639,578; 6,657,772; 6,664,944; 6,680,725; 6,683,333; 6,724,519; 6,750,473; 6,816,147; 6,819,471; 6,825,068; 6,831,769; 6,842,167; 6,842,279; 6,842,657; 6,865,010; 6,967,640; 6,980,196; 7,012,735; 7,030,412; 7,075,703; 7,106,296; 7,110,163; 7,116,318; 7,148,128; 7,167,155; 7,173,752; 7,176,880; 7,190,008; 7,206,119; 7,223,672; 7,230,751; 7,256,766; 7,259,744; 7,280,094; 7,327,511; 7,349,148; 7,352,353; 7,365,394; 7,365,733; 7,382,363; 7,388,572; 7,442,587; 7,492,497; 7,535,624; 7,551,346; 7,554,712; 7,583,427; 7,598,173; 7,605,799; 7,636,191; 7,649,674; 7,667,886; 7,672,040; 7,688,497; 7,733,335; 7,785,988; 7,843,626; 7,859,637; 7,893,435; 7,898,717; 7,957,053; 7,986,450; 8,009,344; 8,027,081; 8,049,947; 8,077,141; 8,089,453; 8,208,193; and 8,373,211; and U.S. Patent Applications Publication Nos. 2002/0060321; 2004/0105036; 2005/0122306; 2005/0122563; 2007/0052757; 2007/0097489; 2007/0109219; 2007/0211002; 2009/0122389; 2009/0315044; 2010/0265239; 2011/0026101; 2011/0140744; 2011/0187683; 2011/0187689; 2011/0286082; 2011/0286086; 2011/0292319; 2011/0292493; 2011/0292494; 2011/0297309; 2011/0310459; and 2012/0182599; and International Application Publication No. WO 00/38000; European Patents Nos. 1,099,207 B1 and 1,145,072 B1;

(e) Color formation and color adjustment; see for example U.S. Pat. No. 7,075,502; and U.S. Patent Application Publication No. 2007/0109219;

(f) Methods for driving displays; see for example U.S. Pat. Nos. 7,012,600 and 7,453,445;

(g) Applications of displays; see for example U.S. Pat. Nos. 7,312,784 and 8,009,348; and (h) Non-electrophoretic displays, as described in U.S. Pat. Nos. 6,241,921; 6,950,220; 7,420,549 and 8,319,759; and U.S. Patent Application Publication No. 2012/0293858.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774; 6,144,361; 6,172,798; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed (using a variety of methods), the display itself can be made inexpensively.

Other types of electro-optic materials may also be used in the present invention. Of particular interest, bistable ferroelectric liquid crystal (FLC's) and cholesteric liquid crystal displays are known in the art.

An electrophoretic display normally comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

The manufacture of a three-layer electrophoretic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium-tin-oxide (ITO) or a similar conductive coating (which acts as one electrode of the final display) on a plastic film, the capsules/binder coating being dried to form a coherent layer of the electrophoretic medium firmly adhered to the substrate. Separately, a backplane assembly, containing an array of pixel electrodes and an appropriate arrangement of conductors to connect the pixel electrodes to drive circuitry, is prepared. To form the final display, the substrate having the capsule/binder layer thereon is laminated to the backplane assembly using a lamination adhesive. (A very similar process can be used to prepare an electrophoretic display usable with a stylus or similar movable electrode by replacing the backplane assembly with a simple protective layer, such as a plastic film, over which the stylus or other movable electrode can slide.) In one preferred form of such a process, the backplane assembly is itself flexible and is prepared by printing the pixel electrodes and conductors on a plastic film or other flexible substrate. The obvious lamination technique for mass production of displays by this process is roll lamination using a lamination adhesive.

As discussed in the aforementioned U.S. Pat. No. 6,982, 178, (see column 3, line 63 to column 5, line 46) many of the components used in electrophoretic displays, and the methods used to manufacture such displays, are derived from technology used in liquid crystal displays (LCD's). For example, electrophoretic displays may make use of a backplane assembly comprising an array of transistors or diodes and a corresponding array of pixel electrodes, and a "continuous" front electrode (in the sense of an electrode which extends over multiple pixels and typically the whole display) on a transparent substrate, these components being essentially the same as in LCD's. However, the methods used for assembling LCD's cannot be used with encapsulated electrophoretic displays. LCD's are normally assembled by forming the backplane assembly and front electrode on separate glass substrates, then adhesively securing these components together leaving a small aperture between them, placing the resultant assembly under vacuum, and immersing the assembly in a bath of the liquid crystal, so that the liquid crystal flows through the aperture between the backplane and the front electrode. Finally, with the liquid crystal in place, the aperture is sealed to provide the final display.

This LCD assembly process cannot readily be transferred to encapsulated displays. Because the electrophoretic material is solid, it must be present between the backplane and the front electrode before these two integers are secured to each other. Furthermore, in contrast to a liquid crystal material, which is simply placed between the front electrode and the backplane without being attached to either, an encapsulated electrophoretic medium normally needs to be secured to both; in most cases the electrophoretic medium is formed on the front electrode, since this is generally easier than forming the medium on the circuitry-containing backplane assembly, and the front electrode/electrophoretic medium combination is then laminated to the backplane assembly, typically by covering the entire surface of the electrophoretic medium with an adhesive and laminating under heat, pressure and possibly vacuum. Accordingly, most prior art methods for final lamination of solid electrophoretic displays are essentially batch methods in which (typically) the electro-optic medium, a lamination adhesive and a backplane are brought together immediately prior to final assembly, and it is desirable to provide methods better adapted for mass production.

Electro-optic displays, including electrophoretic displays, can be costly; for example, the cost of the color LCD found in a portable computer is typically a substantial fraction of the entire cost of the computer. As the use of such displays spreads to devices, such as cellular telephones and personal digital assistants (PDA's), much less costly than portable computers, there is great pressure to reduce the costs of such displays. The ability to form layers of electrophoretic media by printing techniques on flexible substrates, as discussed above, opens up the possibility of reducing the cost of electrophoretic components of displays by using mass production techniques such as roll-to-roll coating using commercial equipment used for the production of coated papers, polymeric films and similar media.

Whether a display is reflective or transmissive, and whether or not the electro-optic medium used is bistable, to obtain a high-resolution display, individual pixels of a display must be addressable without interference from adjacent pixels. One way to achieve this objective is to provide an array of non-linear elements, such as transistors or diodes, with at least one non-linear element associated with each pixel, to produce an "active-matrix" display. An addressing or pixel electrode, which addresses one pixel, is connected to an appropriate voltage source through the associated non-linear element. Typically, when the non-linear element is a transistor, the pixel electrode is connected to the drain of the transistor, and this arrangement will be assumed in the following description, although it is essentially arbitrary and the pixel electrode could be connected to the source of the transistor. Conventionally, in high-resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; again the assignment of sources to rows and gates to columns is conventional but essentially arbitrary, and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode, which is conventionally provided on the opposed side of the electro-optic medium from the non-linear array and extends across the whole display.) After a pre-selected interval known as the "line address time" the selected row is deselected, the next row is selected, and the voltages on the column drivers are changed to that the next line of the display is written. This process is repeated so that the entire display is written in a row-by-row manner.

Processes for manufacturing active-matrix displays are well established. Thin-film transistors, for example, can be fabricated using various deposition and photolithography techniques. A transistor includes a gate electrode, an insulating dielectric layer, a semiconductor layer and source and drain electrodes. Application of a voltage to the gate electrode provides an electric field across the dielectric layer, which dramatically increases the source-to-drain conductivity of the semiconductor layer. This change permits electrical conduction between the source and the drain electrodes. Typically, the gate electrode, the source electrode, and the drain electrode are patterned. In general, the semiconductor layer is also patterned in order to minimize stray conduction (i.e., cross-talk) between neighboring circuit elements.

Electro-optic displays are often used to form large area displays, for example in the form of large signs or billboards. Such large area displays are frequently formed by "tiling" (i.e., juxtaposing) a two-dimensional array of discrete electro-optic displays together since, for technical reasons, such as limitations on the size of backplane assemblies produced by photolithography, individual electro-optic displays cannot economically exceed a certain size. To create the illusion of a single large area display, it is important that the whole visible area of the display be active, with minimal inactive areas between adjacent displays. Unfortunately, conventional electro-optic displays require driver electronics which are normally disposed around the periphery of the display. Such peripheral driver electronics are not a problem when displays are used individually, since the active area of the display is normally surrounded by a bezel which serves to hide the driver electronics. However, such peripheral driver electronics do create a problem when multiple displays are used to form a large area display since the peripheral areas are inherently optically inactive. Accordingly, there is a need a way of tiling electro-optic displays together to form large area displays without introducing inactive areas in peripheral portions of the individual displays.

SUMMARY OF INVENTION

The present invention provides for an electro-optic display having a backplane assembly with at least two electrode layers and at least one interposer layer disposed between the two electrode layers, a first electrode layer of a first dimension electrically connected to and driving a second electrode layer of a second dimension that is larger than the first dimension, such that the entire viewing area of an electro-optic display may be optically-active.

In another aspect, the present invention provides for an electro-optic backplane assembly with at least one interposer layer disposed between at least two electrode layers, a first electrode layer having a first resolution and a second electrode layer having a second resolution that is lower than the first resolution, wherein the first electrode layer is electrically connect to and drives the second electrode layer.

In another alternative aspect of the present invention, the first electrode layer and its associated electrical components are smaller in area compared to the second electrode layer, so that the second electrode layer completely covers the first electrode layer and its components. The second electrode layer, in conjunction with the overlaying electro-optic layer, functions to mask any underlying componentry. Since a second electrode may be much larger than a first electrode and require more current, a plurality of first electrodes may be grouped to drive, and thus meet the increased current demands of, a single second electrode.

In another aspect, the present invention provides for an electro-optic display having a backplane assembly with at least three electrode layers that are electrically connected, wherein the first electrode layer drives the other two electrode layers. A first electrode layer may be a thin-film transistor array (hereinafter "TFT array") that is electrically connected to a third electrode layer disposed on the back surface of a backplane substrate. The third electrode layer is electrically connected to a second electrode layer disposed on the surface closest to the viewing surface of the backplane substrate. The first electrode layer drives the second and third electrode layers, such that the second electrode layer is nearly 100% optically active.

In another aspect, the present invention provides for a backplane assembly with at least three electrode layers, wherein the second and third electrode layers are disposed on a single surface of a flexible backplane substrate and the first electrode layer is attached to the third electrode layer and drives the second and third electrode layers, such that the viewing area may be fully optically active and may be three-dimensional.

DETAILED DESCRIPTION

Figure 1A:
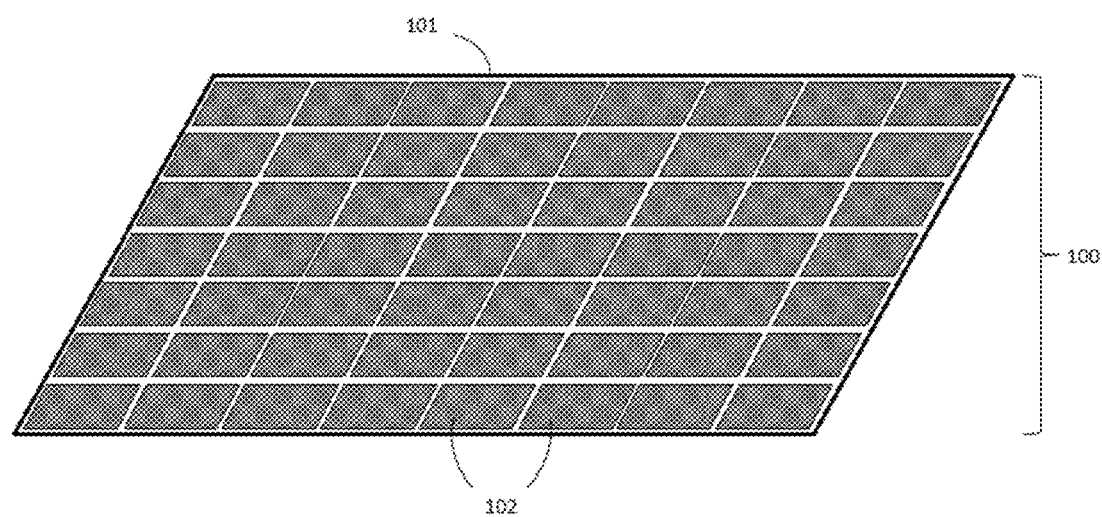
FIGS. 1A-1D are schematic illustrations of a backplane assembly of the present invention showing a top view, a side view and a back view.

As indicated above, the present invention provides for an electro-optic display having a backplane assembly with at least two electrode layers and at least one interposer layer disposed between the two electrode layers, a first electrode layer of a first dimension electrically connected to and driving a second electrode layer of a second dimension that is larger than the first dimension, such that the viewing surface may be completely optically-active.

In another aspect, the present invention provides for an electro-optic display having a backplane assembly with at least three electrode layers and at least one interposer layer disposed between the second and third electrode layers, a first electrode layer electrically connected to a third electrode layer, a third electrode layer electrically connected through an interposer layer to a second electrode layer, wherein the first electrode layer dimension is smaller than the second electrode layer dimension and wherein the first electrode layer drives the second and third electrode layers, such that the viewing surface may be completely optically-active.

In one aspect of the present invention, the first electrode layer is a TFT array, the second electrode layer is an array of display electrodes, the third electrode layer is an array of contact pads aligning with the TFT electrodes of the first electrode layer, and the interposer layer is a printed circuit board. The TFT array is attached to the third electrode layer (or contact pads) on the reverse surface of the printed circuit board and, through the interposer layer, is electrically connected to the display electrode array disposed on the surface of the printed circuit board closest to the viewing surface. The TFT electrodes drive the display electrodes such that the entire viewing surface is optically active. The backplane substrate is at least as large as the TFT array. The interposer layer may have an array of contact pads and conductive vias that electrically connect the TFT electrodes to the display electrodes. In this embodiment, the interposer layer (PCB board) acts as the backplane substrate and should be sized so that the display electrodes extend over the entire area of the backplane substrate.

Typically, a backplane assembly has an array of pixel electrodes. Each pixel electrode forms part of a "pixel unit" which usually also includes a transistor, a storage capacitor, and conductors that electrically connect each pixel unit to a driver chip.

A TFT array is well known in the art. A single TFT pixel typically includes a pixel electrode, a capacitor electrode, and a thin-film transistor. A TFT array comprises source lines, gate lines and common (ground) lines that connect the driver(s) to the electrodes. To address an electrode, voltages are applied to appropriate source lines and gate lines. Changes in the optical characteristics of a display element are achieved by addressing an electrode that is associated with the display element. A TFT array as described herein includes the TFT components as well as the lines and drivers mounted on a substrate such as glass. The TFT components are layered or sandwiched between semiconductor layers to provide electrical connections and prevent cross-talk between neighboring components. The pixel electrode layer is the layer closest to the viewing surface.

Although a pixel electrode is technically a subpart of a pixel unit, the terms "pixel" "TFT electrode" and "pixel electrode" are commonly used interchangeably and refer to a unit cell of a backplane active area. As described herein, an electrode of the first electrode layer will be identified as a "TFT electrode" or a "driving electrode" whereas an electrode of the second electrode layer will be identified as a "display electrode". Although an electrode of the first electrode layer will be identified as a TFT electrode, the first electrode layer may be any suitable electrode array as is known in the art such as transistor arrays or diode arrays.

The term "electrode" as used herein has its ordinary meaning of a conductor through which electricity enters or leaves an object, substance, or region. An electrode is an electrically conductive area that is accessible or exposed. An electrode may be of any suitable conductive material such as copper, conductive ink or other metal. An electrode may be any suitable shape or size, such as square, rectangular, hexagonal or round. An electrode may be a pixel electrode or simply a blob of conductive area.

A substrate provides mechanical support and may act as a platform for electrical interfaces. The substrate that supports the first electrode layer will be identified as the "TFT substrate". The substrate that supports the second electrode layer will be identified as the "backplane substrate" as it supports the backplane assembly.

The TFT substrate may be made of glass, PET or any other suitable material. The TFT array may be electrically and mechanically bonded to the reverse surface of the backplane substrate. The electrical connection between the TFT electrodes and the backplane substrate may be made with an anisotropic conductor or a patterned isotropic conductor. For a patterned isotropic conductor, screen printing, or another printing method such as ink jet printing, may be used.

Moreover, an encapsulated electrophoretic display is highly compatible with flexible substrates. This enables high-resolution thin-film transistor displays in which the transistors are deposited on flexible substrates like flexible glass, plastics, or metal foils. The flexible substrate used with any type of thin film transistor or other nonlinear element need not be a single sheet of glass, plastic, metal foil, though. Instead, it could be constructed of paper. Alternatively, it could be constructed of a woven material. Alternatively, it could be a composite or layered combination of these materials. Likewise, the backplane substrate may be made of any of these flexible materials.

The backplane substrate material may be any suitable material that allows for the fabrication of one or more via apertures, such as polyester, polyimide, multilayered fiberglass, stainless steel, or glass. Holes are punched, drilled, abraded, or melted through where conductive paths are desired, including through any dielectric layers as necessary. Alternatively, the apertures may be formed on the backplane materials prior to assembly and then aligned when assembled. A conductive ink may be used to fabricate and fill the holes. The display electrode may be printed using a conductive ink as is known in the art. The ink viscosity, as well as the aperture size and placement, may be optimized so that the ink fills the apertures. When the reverse surface structures are printed, again using conductive ink, the holes are again filled. By this method, the connection between the front and back of the substrate may be made automatically.

In another alternative, the electrode layers and conductors may be made entirely of printed layers. Conductive and dielectric layers may be printed onto the backplane substrate. A dielectric coating may be printed leaving areas for vias. Then, the second electrode layer of conductive ink may be printed. If necessary, an additional layer of conductive ink can be used before the final ink structure is printed to fill in the holes. Alternatively, electrode layers may be printed on opposing surfaces of the backplane substrate. Vias filled with conductive ink and printed traces connect the electrodes on one side of the substrate to the electrodes on the opposing side.

Any suitable conductive deposition may be used to make electrical connections, including but not limited to, screen printing of conductive ink, solder, physical vapor deposition (i.e., sputtering metal) and chemical vapor deposition.

An interposer is an intermediate layer used for routing conductive lines and vias. The interposer layer may be a printed circuit board with an etched conductor network and conductive vias to electrically connect the two electrode layers. Alternatively, the interposer layer may be any suitable material, such as PET, that allows for circuit elements on two surfaces and conductive interfaces between the two surfaces, where conductive lines and vias may be printed using conductive ink. Line and space rules for electrical traces and via dimension restrictions should be considered when designing the interposer layer. The interposer layer may be more than one layer. Multiple interposer layers may be required for complicated trace and via mapping. The terms "substrate" and "interposer" are often used interchangeably, especially when the interposer layer functions as both the interposer and substrate.

When a printed circuit board is used as the interposer layer, the front of the printed circuit board may have copper pads etched in the desired shape of display electrodes. The display electrodes may be any appropriate shape and size. The plated vias (with an etched wire or conductor structure) connect the display electrodes to the TFT electrodes. The wires may be run to the reverse surface of the printed circuit board and a connection can be made using a standard connector such as a surface mount connector or using a flex connector and anisotropic glue.

Alternatively, a flex circuit such a copper-clad polyimide may be used for the interposer layer. A printed circuit board may be made of polyimide, which acts both as the flex connector and as the backplane substrate. Rather than copper pads, electrodes may be etched into the copper covering the polyimide printed circuit board. The plated through vias connect the electrodes etched onto the substrate of the printed circuit board, which may have an etched conductor network thereon (the etched conductor network is similar to the etched wire structure).

The array of transistors may be manufactured using any one of many appropriate methods. For example, vacuum based methods such as evaporation or sputtering can be used to deposit the materials necessary to form the transistor and thereafter the deposited material can be patterned. Alternatively, wet printing methods or transfer methods can be used to deposit the materials necessary to form the transistors. For fabrication of thin-film transistors, the substrate may be, for example: a silicon wafer; a glass plate; a steel foil; or a plastic sheet. The gate electrodes, for example, may be any conductive material such as metal or conductive polymer. The materials for use as the semiconductor layer, for example, can be inorganic materials such as amorphous silicon or polysilicon. Alternatively, the semiconductor layer may be formed of organic semiconductors such as: polythiophene and its derivatives; oligothiophenes; and pentacene. In general, any semiconductive material useful in creating conventional thin film transistors can be used in this embodiment. The material for the gate dielectric layer may be an organic or an inorganic material. Examples of suitable materials include, but are not limited to, polyimides, silicon dioxide, and a variety of inorganic coatings and glasses. The source and gate electrodes may be made of any conductive material such as metal or conductive polymer.

The array of transistors described may be any type of transistors used for addressing an electronic display. Additional (i.e., resistors) or alternative (i.e., capacitors and transistors) drive components may be used as well. In another implementation, the addressing electronic backplane assembly could incorporate diodes as the nonlinear element, rather than transistors. The present invention is applicable to a variety of electronic displays, including electrophoretic displays, liquid crystal displays, emissive displays (including organic light emitting materials) and rotating ball displays.

FIGS. 1A-1D are illustrative schematics showing the multiple layers of a backplane assembly of the present invention having three electrode layers and an interposer layer. In FIGS. 1A-1D, the first electrode layer is a TFT array of driving electrodes, the second electrode layer is an array of display electrodes, the third electrode layer is an array of contact pads, and the interposer layer is a printed circuit board that also functions as the backplane substrate.

FIG. 1A shows a second electrode layer (100) on a surface closest to the viewing surface of a backplane substrate (101) having an array of display electrodes (102). The display electrodes cover the entire backplane surface and extend to the edges of the backplane substrate. The display electrodes may be printed conductive ink or metallic contact pads applied to the surface of the printed circuit board. The spaces between the display electrodes are minimized, so that the entire viewing surface appears optically active, while maintaining sufficient space to prevent (or reduce) unwanted electrical connections and interference.

Figure 1B:
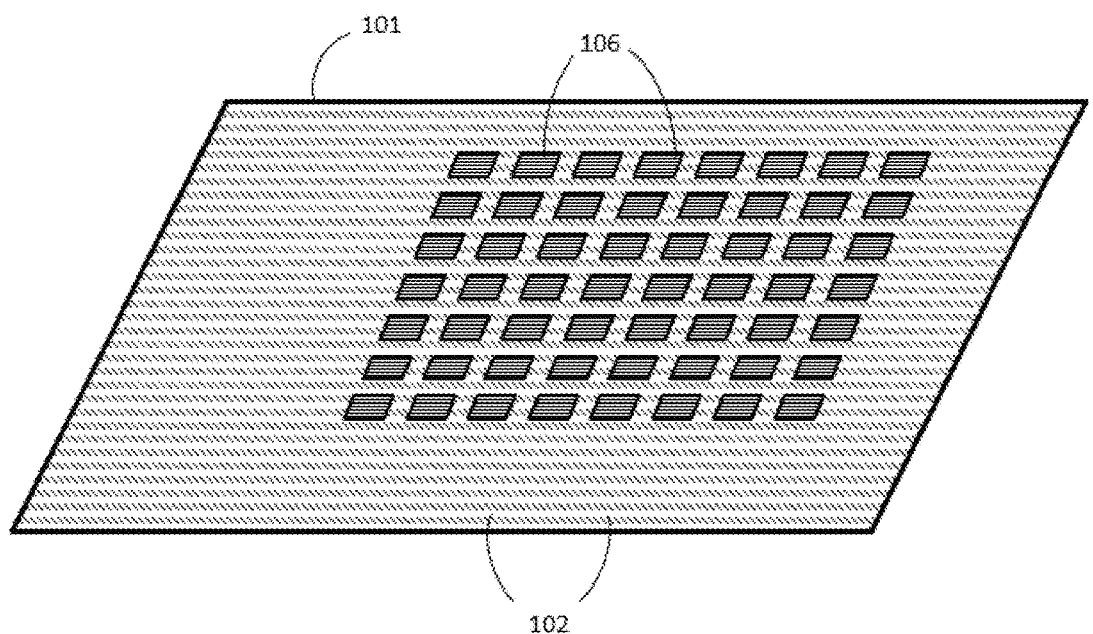

FIG. 1B shows a back view of a backplane substrate (101) of the present invention having a third electrode layer (106), which are referred to as "mating" electrodes. The mating electrodes provide electrical contact points for the driving electrodes of the first electrode layer to connect to the display electrodes of the second electrode layer. In this figure, the interposer layer functions as the backplane substrate (101) with electrode layers on both major surfaces—display electrodes (102) on the surface closest to the viewing surface (not shown) and "mating" electrodes (106) on the reverse surface—and conductive lines connecting the two electrode layers.

Figure 1C:
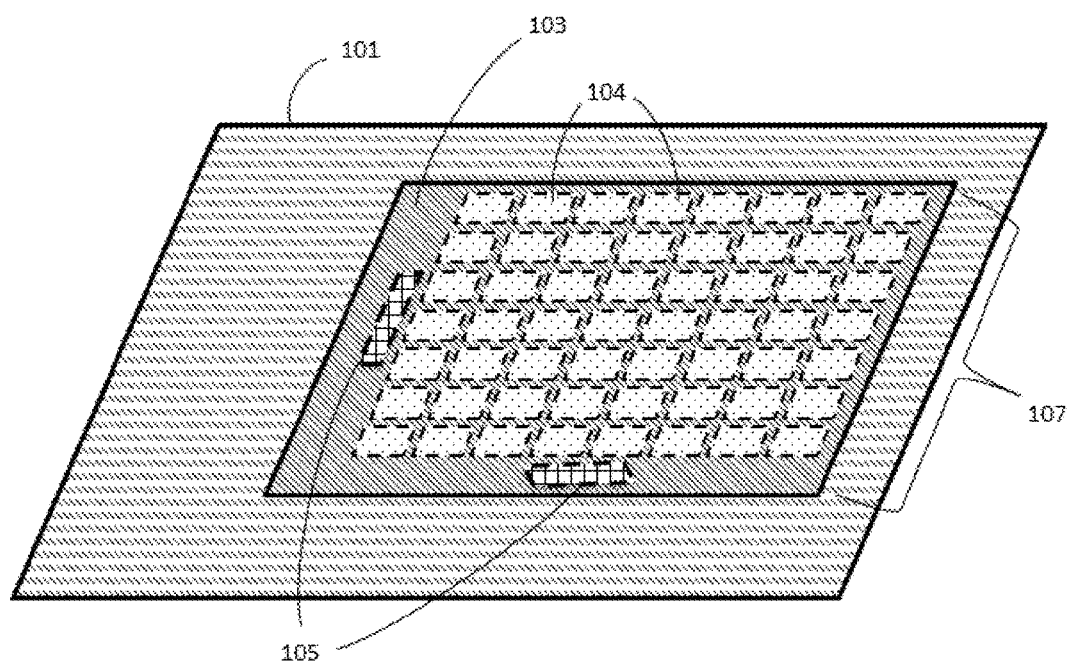

FIG. 1C illustrates a back view of a backplane assembly of the present invention having a first electrode layer (107) attached to the reverse surface of the backplane substrate (101). In this figure, the first electrode layer (107) is an array of driving (i.e., TFT) electrodes (104) and drivers (105) on a TFT substrate (103). (For simplicity, the other TFT electronic components and connections are not shown.) The active surface of the TFT array (107) is fastened to the reverse surface of the backplane substrate and is in contact with the third electrode layer. The dashed lines and light color of the TFT electrodes and drivers indicate that they are buried—i.e., located against the reverse surface of the backplane substrate.

Figure 1D:
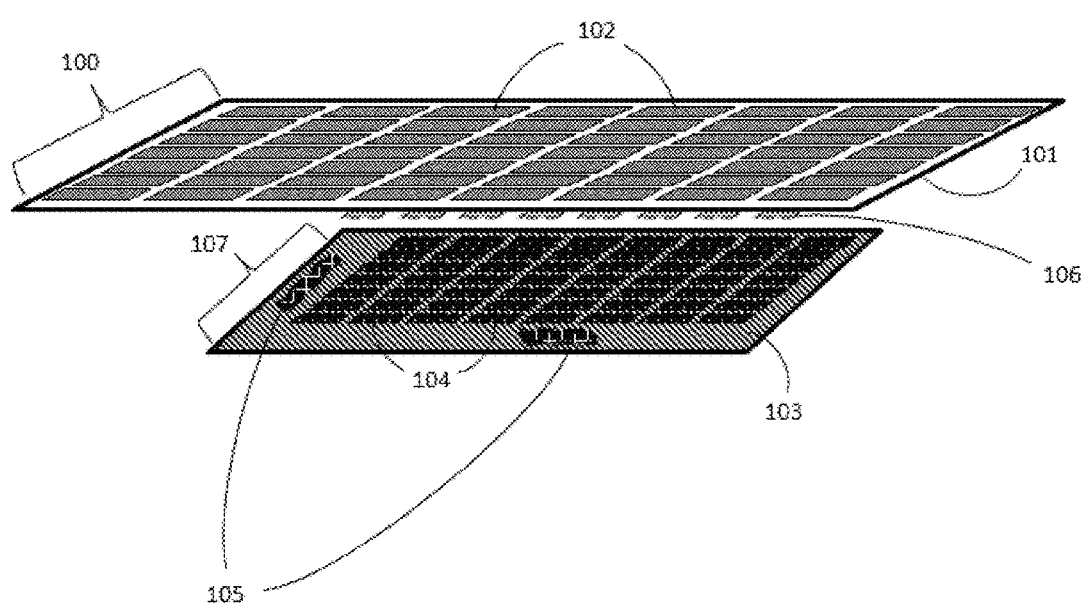

FIG. 1D illustrates a side view of a backplane assembly of the present invention showing how the multiple electrode layers are sandwiched together. The backplane substrate (101) has an array of display electrodes (100) on the surface closest to the viewing surface, an array of mating electrodes (106) on the reverse surface, and an array of TFT electrodes (107) that align with the mating electrodes to form electrical connections. The TFT electrodes (104) and drivers (105), as indicated by the dark color, are on the front surface of the TFT substrate. As depicted, the backplane substrate is used as the interposer layer. The electrical connections on the interposer layer are not shown.

Figure 2:
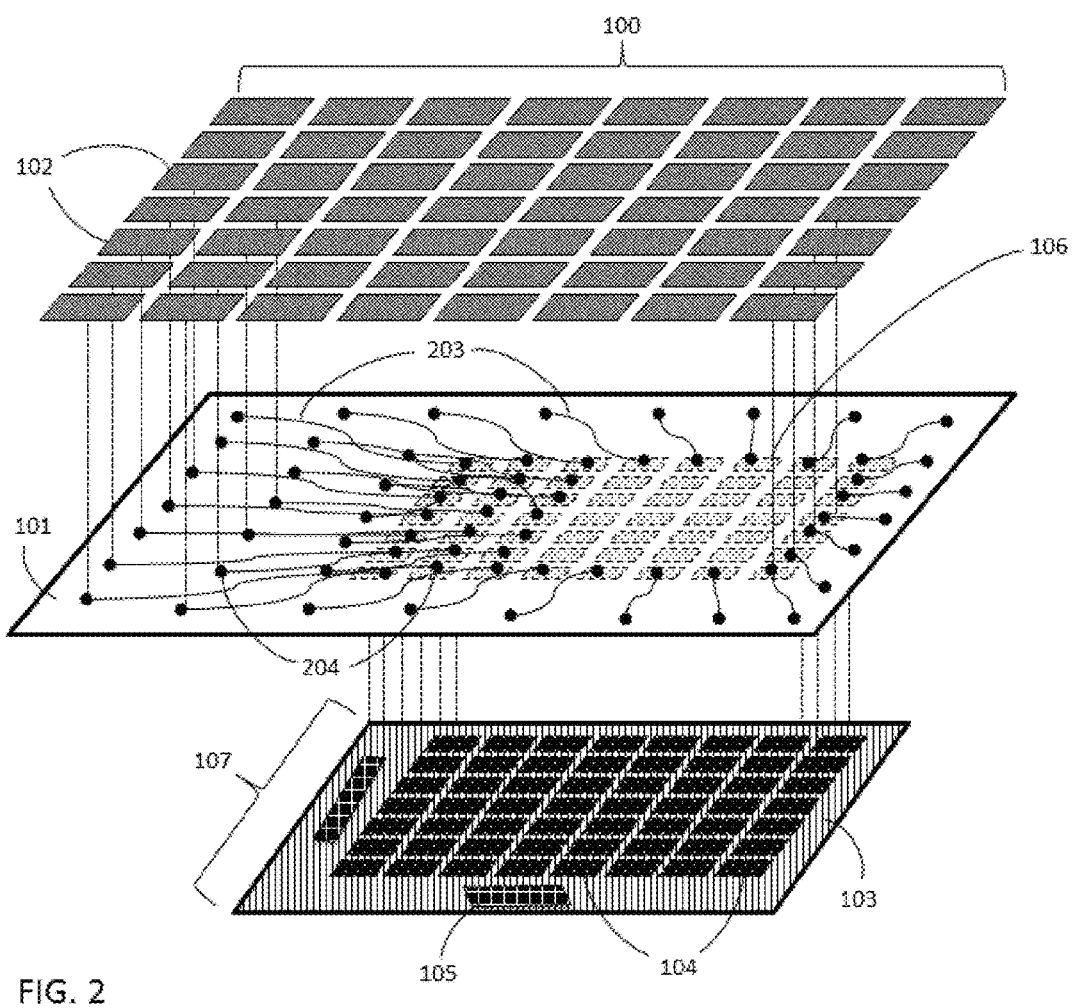
FIG. 2 is an exploded view of a schematic illustration of the present invention showing an interposer layer with a partial mapping of conductive lines and vias.

FIG. 2 is an exploded view of a backplane assembly of the present invention having a first electrode layer (107) aligning and making contact with a third electrode layer of mating electrodes (106) on the reverse surface of a backplane substrate (101) and a second electrode layer (100) attached to the backplane surface closest to the viewing surface. The backplane substrate (101) functions as the interposer layer in this figure. Some of the traces (203) and vias (204) that electrically connect the first electrode layer to the second electrode layer through the third electrode layer and the interposer layer are shown. For clarity, only some of the traces and vias are depicted in the drawing.

In FIG. 2, there is a one-to-one-to-one connection between the driving electrodes, the mating electrodes and the display electrodes. Each driving electrode is electrically connected to (shown for only some of the electrodes) and drives a single display electrode. As illustrated, the second electrode layer completely covers the first electrode layer and its electrical components, which, as depicted, is approximately two-thirds the size of the second electrode layer. The number of display electrodes in the second electrode layer should equal the number of electrodes (contact pads) in the third electrode layer.

The gap distance between the third electrode layer on the backplane substrate and the TFT electrodes need not be uniform. The gap distance should be at least one TFT electrode wide and within the printed circuit board design trace and space rules. As long as the conductor pads do not flow together and the electrodes remain functional without excessive cross-talk, a tighter gap distance may be used. Typically, anisotropic conductors do not require patterning and function with narrow gap distances. Anisotropic conductors typically have a monolayer of monodisperse conductive metal spheres. In areas where a single sphere spans the entire gap distance between the TFT electrode and the backplane substrate (conductive via) an electrical connection will be made through the sphere. An electrical connection is made where the gap is exactly the right thickness. While the most common anisotropic materials contain conductive spheres, the conductors may be filaments, discontinuous networks, or any other known conductors. Anisotropic conductors are preferred when bonding a rigid surface (glass or FR-4) to a flexible surface (Kapton PCB). Alternatively, a patterned isotropic adhesive may be used to electrically connect the electrode layers.

The interposer layer may have apertures filled with conductive material to form vias to interconnect electronic components on opposing sides. The via apertures may be, for example, etched, punched, drilled or laser-drilled through the polymeric material of the backplane substrate so as to connect the electronic components on the viewing side to the electrode array on the reverse side. The via apertures may be filled using a variety of materials and techniques including printing (for example, ink-jet, screen, or offset printing) application of conductive resins, shadow-mask evaporation or conventional photolithographic methods.

The number of display electrodes should equal the number of contacts on the backplane substrate. The number of TFT electrodes may equal the number of display electrodes. Alternatively, the TFT electrodes may be grouped and multiple TFT electrodes may be connected to a single display electrode where the number of TFT electrodes exceeds the number of display electrodes. TFT electrodes may be grouped to electrically connect all TFT electrodes to display electrodes. Preferably, TFT electrodes are grouped so that active TFT electrodes are separated by at least one row and at least one column of inactive TFT electrodes to reduce cross-talk between electrodes. The inactive areas will still be driven by the controller, but are not electrically connected and will not be used or, as described herein, inactive.

Figure 3:
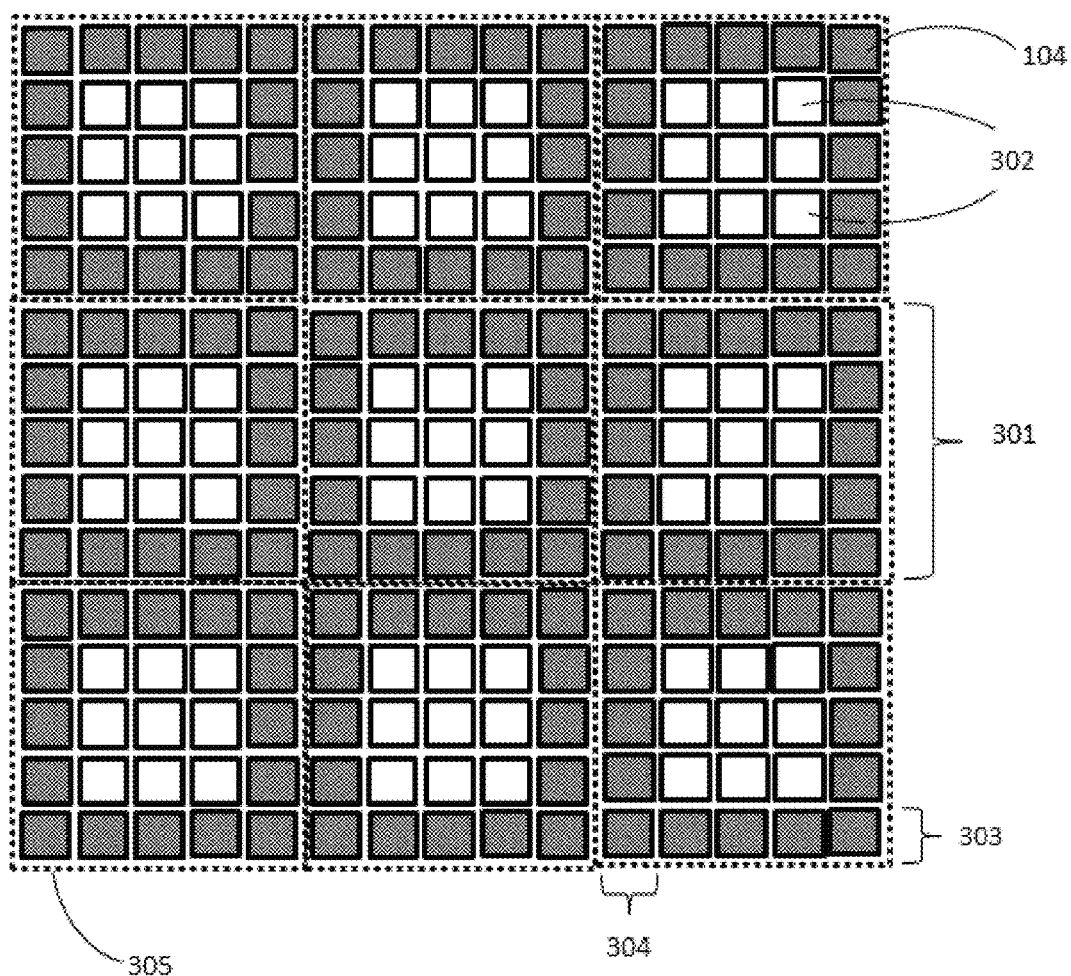
FIG. 3 is a schematic illustration of a first electrode layer of the present invention showing grouped electrodes.
Figure 4A:
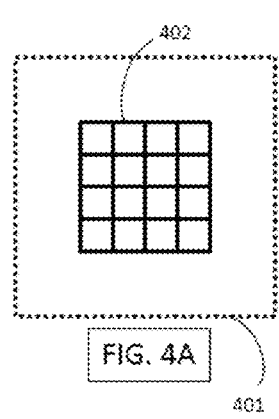
FIGS. 4A-4F are schematic illustrations depicting a layer-by-layer fabrication of a backplane assembly of the present invention.

FIG. 3 illustrates the grouping of multiple TFT electrodes (104) into active and inactive areas according to the present invention. FIG. 4A shows a 15×15 TFT array grouped into nine 5×5 arrays (301). (The dotted lines (305) in the figure are included to clearly identify the 5×5 arrays.) The inner 3×3 electrodes (302) of each 5×5 array (301) indicate an active area of grouped TFT electrodes that are electrically connected to a single display pixel electrode. The adjacent electrode rows (303) and columns (304) indicate surrounding inactive electrode areas that act as buffers to reduce cross-talk. The TFT electrodes may be grouped in larger or smaller quantities depending on the desired display criteria. If the display electrodes are significantly larger than (i.e., more than 10 times) the TFT electrodes, more TFT electrodes may be grouped to meet current demands. Likewise, the areas of inactive TFT electrodes may be more or less depending on design criteria and manufacturing capabilities.

First electrodes may be grouped together by a common contact pad. Alternatively, first electrodes may be grouped with one common electrode where the drain of each transistor in the group is connected to the common electrode. Typically, when first electrodes are grouped, a buffer of at least a row and at least a column of unused electrodes may surround the grouped electrodes to prevent interference and cross-talk.

FIGS. 4A-4F illustrate a printed backplane assembly of the present invention. FIG. 4A is an illustrative schematic of a first electrode layer (402) showing a 4×4 array of TFT electrodes printed on a backplane substrate (401). (The electrical components are not shown.) As illustrated, the area of TFT electrodes is smaller than the area of the backplane substrate, however, electro-optic product/display requirements (i.e., build criteria) will determine the total TFT electrode area, which may be less or more than depicted.

Figure 4B:
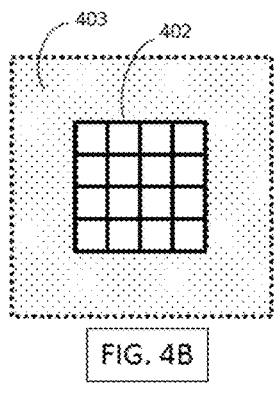

FIG. 4B shows a first dielectric layer (403) overlaying the first electrode layer where the TFT electrodes (402) are exposed. The dielectric layer may start at the edge of the TFT electrode layer or may overlap a portion (outer edge) of the TFT electrode layer.

Figure 4C:
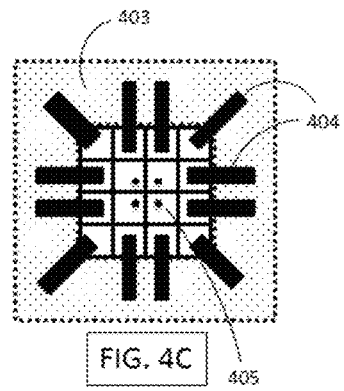

FIG. 4C shows a next layer of printed conductors (404, 405) that are positioned to electrically connect to a TFT electrode (402) and expand outwards. The conductors of the inner four TFT electrodes (405) directly connect to a display electrode. The conductors of the outer ring of TFT electrodes (404) extend or fan-out towards the edges of the dielectric (403) to connect to the larger expanded display electrodes.

Figure 4D:
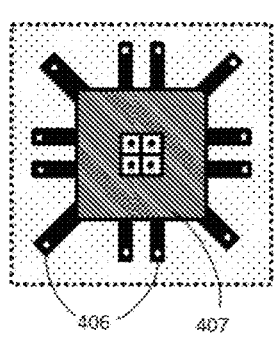

FIG. 4D shows a second dielectric layer (407) overlaying the TFT electrodes and the printed conductor layer such that the inner conductors (405) and the fan-out conductors (404) that extend beyond the edges of the second dielectric layer are exposed. The dielectric layers cover the conductors to prevent unwanted connections and cross-talk while providing the necessary electrical contacts. The layers in FIGS. 4B, 4C and 4D make up a multi-layered interposer layer.

Figure 4E:
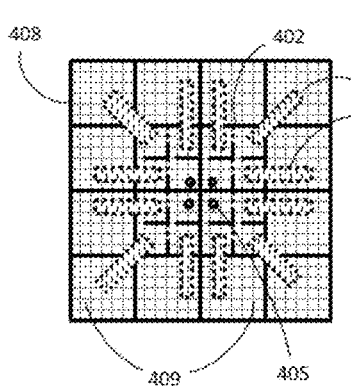

FIG. 4E shows a second electrode layer (408) that extends to the edges of the backplane substrate (401) and completely overlays the first electrode layer (402) and the interposer layer (403, 404, 405, 407). The second electrode layer is a 4×4 array of display electrodes (409). The display electrodes are printed to form electrical connections from each TFT electrode to a corresponding display electrode. These connections are buried beneath the display electrodes but are indicated by the hollow dots (405) and the dotted lines (404).

Figure 4F:
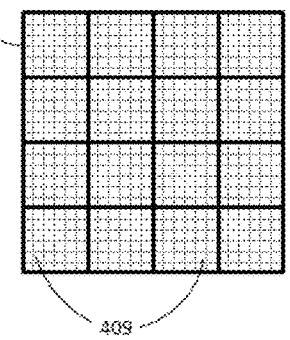

FIG. 4F is a schematic illustration of a second electrode layer (408) of the present invention showing a surface closest to the viewing surface consisting of sixteen display electrodes (409) that is nearly 100% optically active.

The electro-optic display may have a front plane comprising, in order beginning from the surface of the backplane assembly closest to the viewing surface, a layer of electro-optic material disposed on the second electrode layer (display pixel electrode array), a single continuous electrode disposed on the electro-optic material and, optionally, a front protective layer or other barrier layers. The upper surface of the protective layer forms the viewing surface of the display. An edge seal may extend around the periphery of the electro-optic material to prevent the ingress of moisture to the electro-optic material.

In another aspect, this invention provides for an electro-optic display wherein the electro-optic material masks the electrical connections such that the viewing surface may be completely optically-active. The electro-optic layer attaches to the display electrode layer such that, essentially, the entire viewing surface is optically active. The electro-optic material of the front plane laminate may overlay the display electrodes to obscure the backplane assembly connections from the viewing surface. The display electrode layer may be light transmissive when the electro-optic layer acts to mask the underlying components on the backplane assembly. In another aspect, the electro-optic material of the front plane laminate may extend beyond the display electrodes to obscure the backplane assembly connections from the viewing surface.

Figure 5:
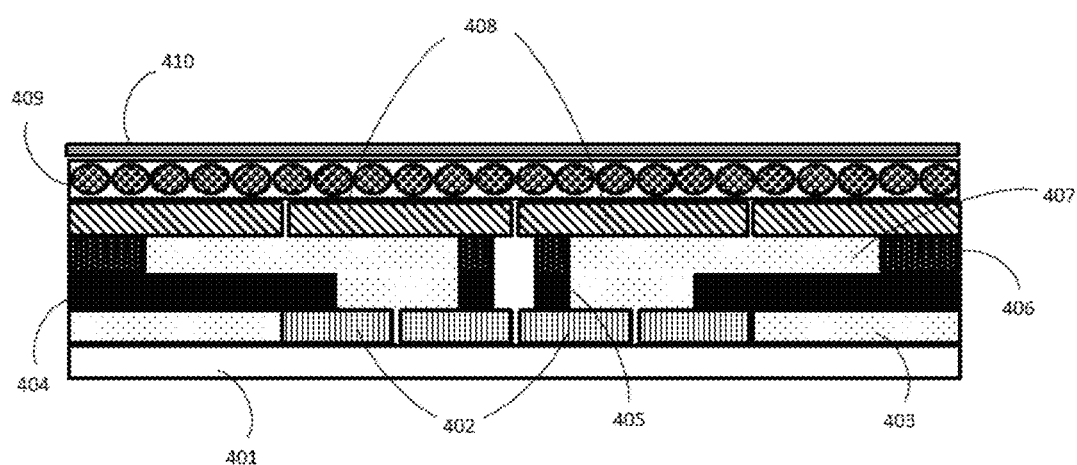
FIG. 5 is a schematic illustration of a cross-section of an electro-optic display containing a backplane assembly of the present invention having two electrode layers.

FIG. 5 is a cross-section of an electro-optic display having a backplane assembly of the present invention as depicted in FIGS. 4A-4F. The first layer is a backplane substrate (401) to which a first electrode layer of four electrodes (402) is attached. The next layer is a dielectric layer (403) that frames the first electrode layer. The next layer is a layer of conductive lines and pads (404, 405) that connect a first electrode to a second electrode. A second dielectric layer (407) is applied to expose the electrical contacts that extend vertically (406) and connect the electrodes of the first electrode layer (402) to the electrodes of the second electrode layer (408). Alternatively, the electrical contacts (406) may be applied after the second dielectric layer is applied. Additional interposer layers (i.e., conductor and dielectric layers) may be included. A layer of electro-optic material (409) with a front electrode (410) overlays the second electrode layer. As illustrated, the electrical connections connect a single first electrode to a single larger second electrode such that the viewing surface of the display is completely active. As described previously, first electrodes may be grouped and multiple first electrodes may be electrically connected to a single second electrode.

Figure 6:
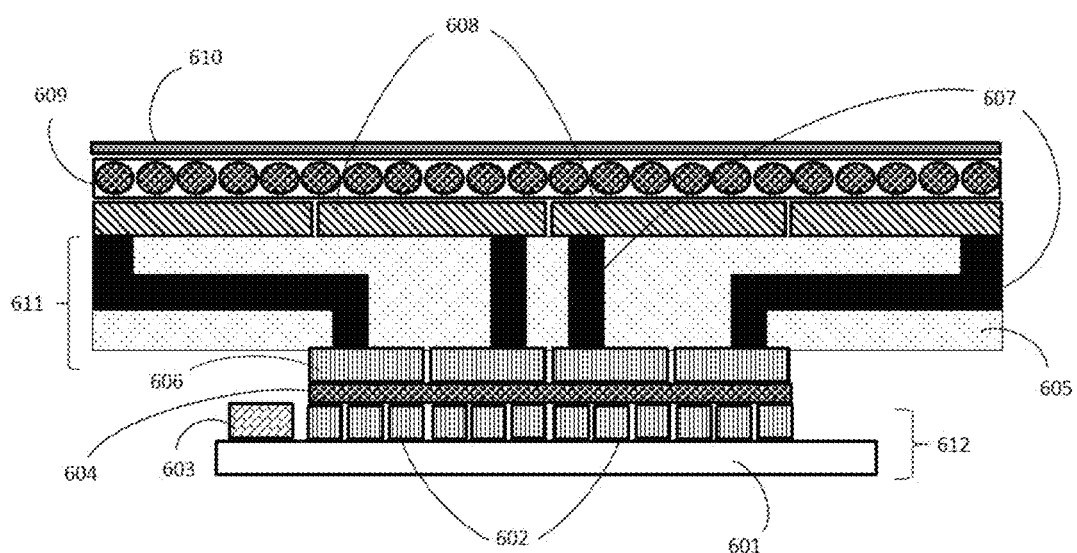
FIG. 6 is a schematic illustration of a cross-section of an electro-optic display containing a backplane assembly of the present invention having three electrode layers.

FIG. 6 is a cross-section of an electro-optic display having a backplane assembly of the present invention having three electrode layers. The first electrode layer is a TFT array (612). FIG. 6 shows a TFT array (612) with a TFT substrate (601), a first electrode layer of twelve TFT electrodes (602) and a TFT driver (603) mounted alongside the TFT electrodes. The next layer is a layer of anisotropic film (604) that electrically connects three TFT electrodes (602) to a single mating electrode (606) in the third electrode layer. The third electrode layer has four mating electrodes (606). As depicted, each mating electrode is connected to at least three TFT electrodes, but may be connected to a larger array of TFT electrodes. The next layer is the interposer layer (611) which contains layers of dielectric material (605) and conductive lines and vias (607) connecting electrodes of the third electrode layer (606) to electrodes of the second electrode layer (608). A layer of electro-optic material (609) with a front electrode (610) overlays the second electrode layer. As illustrated, the electrical connections connect three first electrodes to a single larger second electrode such that the viewing surface of the display is completely active.

Electro-optic display size and resolution may be optimized according to the electro-optic display application, substrate materials and printed circuit board design guidelines. Pixel size may vary from approximately 100 µm×100 µm for TFT electrodes to more than 10 mm×10 mm for display electrodes. Individual electro-optic displays may range in size from as large as multiple feet squared to as small as less than an inch squared. The number of driver chips may be optimized according to design rules. For a TFT array, at least one driver chip may be used. Preferably, at least two driver chips are used; one to drive the gate lines and one to drive the source lines.

The continuous front electrode may have connections on a non-viewing side of the backplane assembly. Alternatively, front electrode connections may be made on the viewing surface. Such connections create non-active areas on the viewing surface. These non-active areas are usually approximately 2 mm in diameter but may be larger or smaller depending on the display voltage requirements and the total number of connections. In comparison to the overall active viewing area, the display may still appear to be 100% active. In the present invention, an active viewing area of at least 95% is preferred.

A backplane assembly of the present invention having three electrode layers and a printed circuit board interposer layer may be fabricated according to the following criteria. The first electrode layer is an active matrix TFT on a substrate that is approximately 6 inches diagonal in size (approximately 152 mm) having a resolution of 800×600 pixels (TFT electrodes) and an active area of approximately 122 mm by 90 mm. (A TFT electrode size is approximately 150 µm×150 µm.) The TFT substrate is glass and has a dimension of approximately 134 mm by 102 mm, which provides about a 12 mm border around the TFT active area. In the border area of the TFT substrate, three column drivers are attached on the 134 mm side and two gate drivers are attached on the 102 mm long side of the TFT substrate. Preferably, the drivers are chip on flex (COF) mounted drivers, which are very thin. A flat flexible cable (FFC) connector approximately 11 mm in length is located on the 134 mm side. The FFC connector powers the backplane assembly and allows for the connection of control signals.

The TFT electrodes are grouped into 20×20 arrays, which equates to approximately 3 mm×3 mm arrays. The TFT electrodes are grouped by applying a 40×30 array of about 1.6 mm$^3$ thermally curable silver filled epoxy droplets on the TFT electrodes. The droplets are applied with a spacing of 3 mm center to center. The droplet array covers approximately 118 mm by 88 mm of the TFT active area. When compressed, each droplet expands to a contact diameter of 2 mm, which allows for a 1 mm gap (inactive area) between droplets. The epoxy connections are not cured until after the complete device is assembled.

The interposer layer consists of a multi-layered printed circuit board having dimensions of approximately 160 mm by 120 mm. The print circuit board is designed with a third electrode layer on one major surface and a second electrode layer on the other major surface with conductors connecting the two electrode layers. The second electrode layer is closest to the viewing surface of the display.

The third electrode layer is a 40×30 array of copper contact pads arranged to mirror and electrically connect to the epoxy droplet array on the TFT electrodes in the first electrode layer. All other areas of the third electrode layer are covered by a dielectric film.

The second electrode layer is a 40×30 array of 3.8 mm by 3.8 mm gold-plated copper display electrodes spaced 4 mm, center to center. The 40×30 array of display electrodes are connected to the 40×30 array of mating electrodes by a series of plated vias and traces (also commonly referred to as lines) in the middle and bottom copper layers of the printed circuit board. Only one via per display electrode is drilled through to contact the second electrode layer. All other vias necessary for routing a signal between the layers will be "blind vias". Any exposed traces in the bottom copper layer are covered in dielectric film to prevent electrical shorts and unwanted electrical connections.

The final assembly step requires connecting the first electrode layer with the third electrode layer on the interposer layer, which already has the second layer electrode layer and all necessary conductors. The uncured epoxy droplets of the first electrode layer (the TFT array) are aligned with the copper pads of the third electrode layer (interposer layer), pressed together and cured. The epoxy droplets will compress to approximately 0.5 mm, resulting in a final contact diameter of approximately 2 mm with a 1 mm gap of inactive area between epoxy droplets.

The continuous front plane electrode of the electro-optic display may be connected through vias to front plane electrodes on the TFT array or may be connected to a non-viewing surface of the backplane assembly (711). For non-viewing surface front plane connections, two front plane connection electrodes are mounted in the border area immediately adjacent to the TFT active area. A 1 mm$^3$ thermally curable silver filled epoxy droplet is applied to each of the two front plane connection electrodes on the TFT array. On the reverse surface of the printed circuit board (the surface containing the third electrode layer), two exposed 5 mm by 10 mm copper pads are placed within 1 mm of the printed circuit board edge and are connected by copper traces to the front plane connection electrodes on the TFT array. The front electrode is wrapped around the printed circuit board to contact the copper pads on the back side. The epoxy connections may be cured after the complete device is assembled.

Figure 7A:
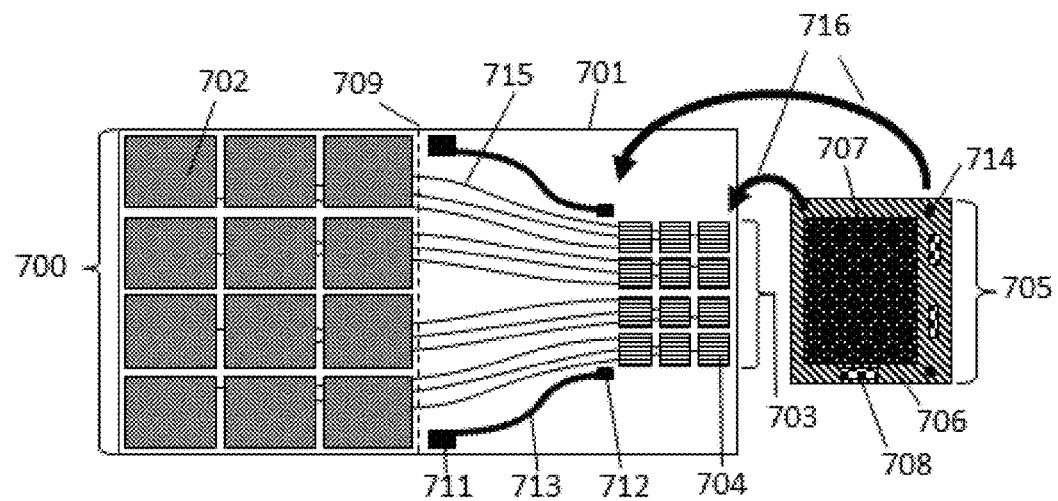
FIGS. 7A & 7B are schematic illustrations of the present invention showing a backplane assembly with at least three electrode layers where two of the electrode layers are disposed on a foldable backplane substrate.
Figure 7B:
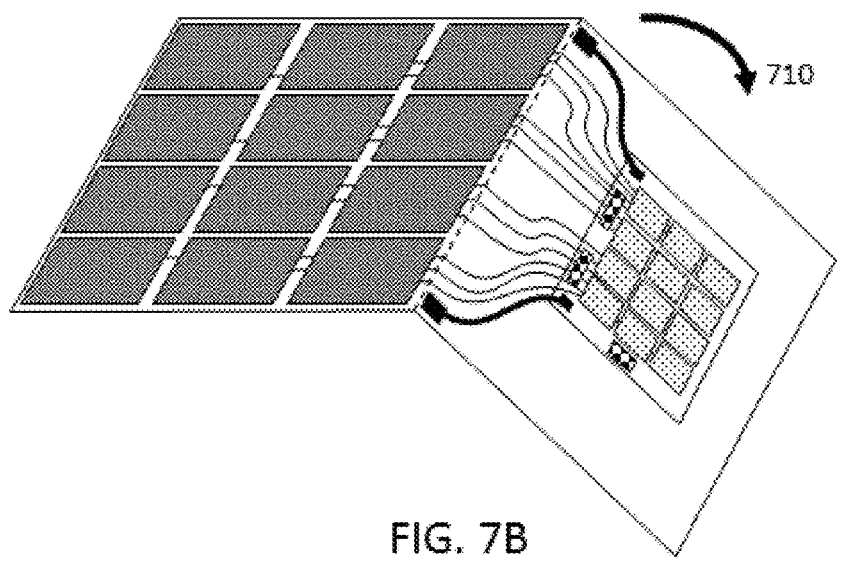

In another alternative of the present invention, a flexible backplane substrate may be patterned with conductor and dielectric patterns to create a multi-layered circuit on a single surface of the flexible substrate. FIGS. 7A & 7B are illustrative schematics of an alternative embodiment of the present invention showing a backplane assembly with at least three electrode layers, wherein the second and third electrode layers are disposed on a flexible backplane substrate. A second electrode layer (700) consisting of an array of display electrodes (702) is printed on a portion of a flexible substrate (701). A third electrode layer (703) consisting of an array of mating electrodes (704) is printed on another portion of the backplane substrate (701). Conductive traces (715) electrically connect a single second electrode (702) to a single third electrode (704). The backplane is divided into two areas—the display electrode area and the remaining area (containing the mating electrodes and any other connections)—with a fold (709) at the edge of the display electrode area. The backplane substrate is folded (710) at the fold (709) so that the third electrode layer is located opposite the second electrode layer.

In this embodiment, the backplane substrate (701) may be any suitable material that is flexible, durable and has the ability to be wrapped, curved, folded, creased, bent, conformed or elongated to double back on itself. The fold (709) may have as small a bend radius as the conductor and dielectric material allow for maintaining connections. The fold may be any angle between 0 and 180 degrees, and may be made in a single bend or in multiple bends. PET is a preferred flexible backplane substrate.

The second and third electrode layers may be printed on the substrate using known screen printing techniques. A layer of dielectric film may be placed between the electrodes and conductive traces to avoid unintended electrical connections. Any intentional connections between traces and electrodes may be made through holes patterned into the dielectric. Typically, the conductive traces will be printed first. A dielectric layer with apertures or vias that align to allow for connections from the traces to the electrodes will be printed next. Finally, the electrodes are printed so that conductive ink fills the apertures and electrically connects the traces and the electrodes.

A first electrode layer (705) consists of an array of TFT electrodes (707) and drivers (708) on a substrate, such as glass (706). (For simplicity, the other TFT electronic components and connections are not shown.) The active surface of the TFT electrodes (707) of the first electrode layer are aligned with the mating electrodes (704) of the third electrode layer and electrically connected using anisotropic conductor or other suitable material. Alignment and connection of the active areas of the first electrode layer to the third electrode layer may be made by flipping (716) the first electrode layer on top of the third electrode layer.

The TFT array may be attached to the third electrode layer before the backplane substrate is folded over—i.e., an anisotropic conductor is applied to the TFT electrodes, then the TFT array is flipped over so that the active area of the TFT electrodes marries up with the mating electrodes. Alternatively, the anisotropic conductor may be applied to the mating electrodes of the third electrode layer, and the TFT array is flipped over, aligned and attached. In another alternative, the third electrode layer may be folded over first, and then the first electrode layer is aligned and attached as described previously.

While the figures depict the backplane assembly of the present invention as a flat, rectangular array, a flexible backplane assembly of the present invention may be folded into various shapes and forms. The display electrode area may be any shape, such as circular or forked, and may have internal cut-outs, such as a ring. Additionally, the display electrode area may be curved or folded into three-dimensional shapes, including cylindrical, spherical, cubed or polyhedron. Depending on the flexibility of the backplane substrate and associated connections, the size and rigidity of the TFT array and the flexibility of the FPL, a fully active viewing area having complex curves may be formed.

Alternatively, a more rigid sub-layer may be added to provide support and strength to the foldable backplane substrate. The sub-layer should equal the area of the display electrodes so that when folded, the remaining area is located on the reverse surface. The sub-layer material may be any suitable material including, but not limited to, metal, thick PET, polycarbonate, acrylic and ABS plastic.

FIGS. 7A & 7B also show electrical contacts for non-viewing surface front plane connections. Two front plane connection electrodes (714) are mounted near the edge of the TFT array on the first electrode layer (705). These electrodes (714) connect to drivers, controllers and/or other electrical components of the TFT array. (These connections are not shown in the figure.) Front plane connection electrodes (714) on the TFT electrode layer align with the corresponding mating electrodes (712) on the third electrode layer. Conductive adhesive, epoxy or other suitable conductive material may be used to make the electrical connection between these electrodes. Conductive traces (713) connect the front plane mating electrodes (712) to the corresponding front plane connection electrode (711) at the edge of the substrate where the continuous front plane electrode makes contact using a conductive via or by other known means.

Figure 8A:
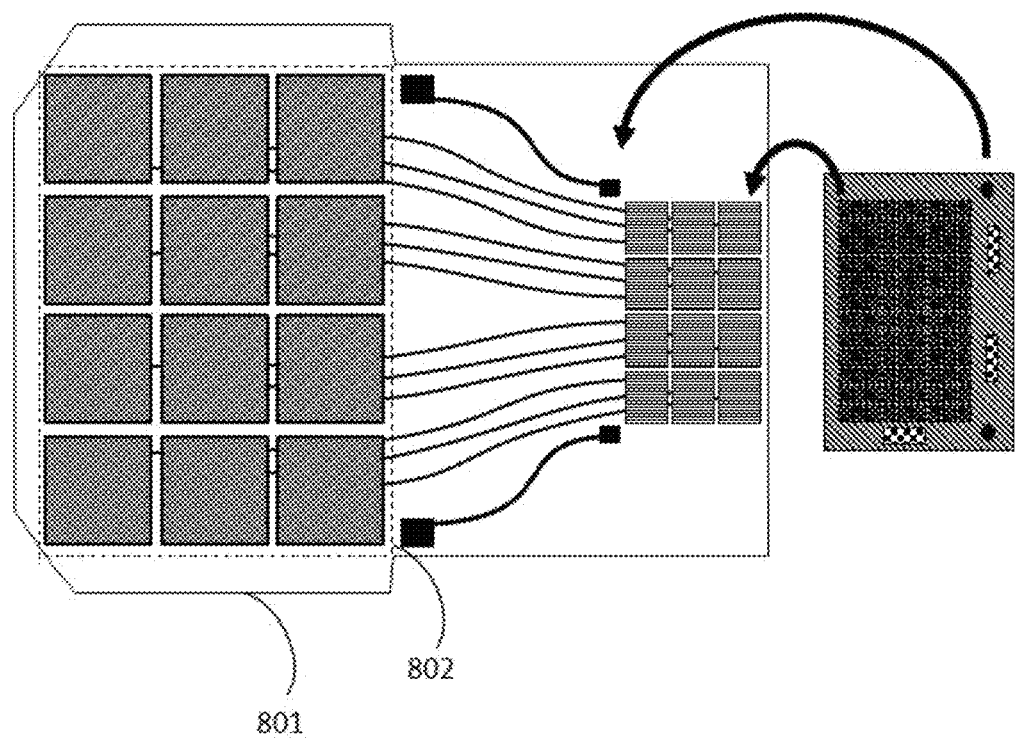
FIGS. 8A & 8B are schematic illustrations of the present invention showing an extended backplane substrate with alternative front electrode connections.

FIG. 8A is a duplicate of FIG. 7A showing another alternative of a backplane assembly of the present invention. The backplane substrate may extend beyond the edges of the display electrodes (801) such that an edge seal may be applied as described in U.S. Pat. No. 7,649,674, filed Dec. 19, 2006, and related patents and publications. Any extra substrate may be folded over and attached to reverse surface. As in FIG. 7B, the backplane substrate may be folded at the fold (802) so that the third electrode layer is located opposite the second electrode layer. A barrier film may be applied to the FPL and any or all layers may be folded over to attach to the backplane substrate. In addition, a barrier and edge seal may be incorporated on the reverse surface of the backplane substrate.

Figure 8B:
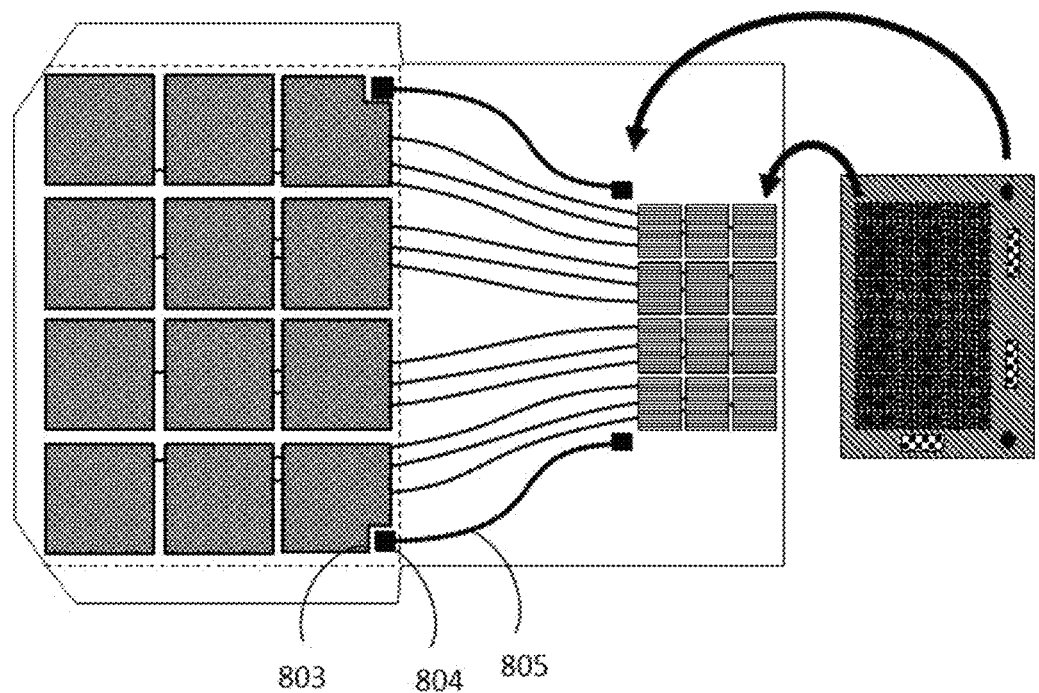

In one aspect of this invention, as shown in FIG. 8B, a front plane laminate has a connection area, where the front electrode is exposed free from the electro-optic medium and the adhesive layer, and, when attached to the backplane, is in electrical contact with a non-viewing surface of the backplane. This connection area may be formed by a contact pad of electrically-conductive material, such as conductive ink, metal or other similar material. A contact pad may be located on any non-viewing surface of a backplane. Preferably, a contact pad is located on the reverse side of a backplane. A connection area may include a conductive adhesive that attaches a front electrode to a contact pad on the backplane. A conductive adhesive may be any suitable adhesive such as a pressure sensitive adhesive filled with silver or carbon black, or a fluid dispensed adhesive that must be cured such as a silver filled epoxy. Alternatively, the connection area may be made via a mechanical means such as a screw terminal or clamping mechanism. FIG. 8B shows the front electrode connections on the front surface. To make the front electrode connection, a small area or notch of the display pixel (803) is cut out and a contact pad to the front electrode is added (804) with a conductive trace (805) to ultimately connect it to the driver. Alternatively, the front electrode may extend beyond the pixel area, so that the front electrode contact area is beyond the display pixel area on the front surface. The front electrode area may be extended by as little as 1 mm to make an electrical connection.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

What is claimed is:

1. A backplane comprising at least two electrode layers, a first electrode layer comprising at least one row of driving electrodes, the driving electrodes having a first dimension, and a second electrode layer comprising at least one row of display electrodes, wherein each display electrode of the at least one row of display electrodes is associated with one driving electrode out of the at least one row of driving electrodes, the display electrodes having a second dimension larger than the first dimension, and the one driving electrode drives only the associated display electrode.

2. A backplane of claim 1 further comprising at least one interposer layer disposed between the first and second electrode layers.

3. A backplane of claim 2, wherein the interposer layer comprises conductive vias that form the electrical connections between the driving electrodes and the display electrodes.

4. A backplane of claim 1, having a plurality of parallel rows of driving electrodes and a plurality of parallel rows of display electrodes.

5. A backplane of claim 1, wherein each display electrode is electrically connected to and driven by more than one driving electrode.

6. A backplane of claim 1, wherein the second electrode layer is stacked on top of the second electrode layer.

7. A backplane of claim 2, wherein the first electrode layer and the second electrode layer are arranged on discrete areas of a single major surface of a common substrate.

8. A backplane of claim 7, wherein the common substrate is folded so that the second electrode layer overlies the first electrode layer.

9. A backplane of claim 1, wherein the first electrode layer is a TFT array.

10. An electro-optic display comprising a backplane according to claim 1 and a layer of electro-optic material disposed adjacent the backplane.

11. An electro-optic display according to claim 10 wherein the electro-optic material comprises a rotating bichromal member, electrochromic or electro-wetting material.

12. An electro-optic display according to claim 10 wherein the electro-optic material comprises an electrophoretic material comprising a plurality of electrically charged particles disposed in a fluid and capable of moving through the fluid under the influence of an electric field.

13. An electro-optic display according to claim 10 wherein the electrically charged particles and the fluid are confined within a plurality of capsules or microcells.

14. An electro-optic display according to claim 10 wherein the electrically charged particles and the fluid are present as a plurality of discrete droplets surrounded by a continuous phase comprising a polymeric material.

15. An electro-optic display according to claim 10 wherein the fluid is gaseous.

* * * * *